United States Patent
Petithomme

(10) Patent No.: US 11,354,382 B2
(45) Date of Patent: Jun. 7, 2022

(54) DIGITAL SIGNAL PROCESSOR AND METHOD OF OPERATION

(71) Applicant: MENTA, Valbonne (FR)

(72) Inventor: Stéphane Petithomme, Rives (FR)

(73) Assignee: MENTA, Valbonne (FR)

( * ) Notice: Subject to any disclaimer, the term of this patent is extended or adjusted under 35 U.S.C. 154(b) by 0 days.

(21) Appl. No.: 17/251,720

(22) PCT Filed: Jun. 19, 2019

(86) PCT No.: PCT/EP2019/066249
§ 371 (c)(1),
(2) Date: Dec. 11, 2020

(87) PCT Pub. No.: WO2019/243443
PCT Pub. Date: Dec. 26, 2019

(65) Prior Publication Data
US 2021/0117497 A1    Apr. 22, 2021

(30) Foreign Application Priority Data

Jun. 22, 2018 (EP) .................................. 18305800

(51) Int. Cl.
*G06F 17/10* (2006.01)
*G06F 9/30* (2018.01)
*G06F 9/38* (2018.01)

(52) U.S. Cl.
CPC ............ *G06F 17/10* (2013.01); *G06F 9/3001* (2013.01); *G06F 9/30036* (2013.01); *G06F 9/3885* (2013.01)

(58) Field of Classification Search
None
See application file for complete search history.

(56) References Cited

U.S. PATENT DOCUMENTS

| | | | | |
|---|---|---|---|---|
| 5,621,730 A | * | 4/1997 | Kelley | G01S 19/13 370/345 |
| 5,654,909 A | * | 8/1997 | Sun | H03H 17/08 708/300 |

(Continued)

FOREIGN PATENT DOCUMENTS

| | | |
|---|---|---|
| EP | 1 120 708 A2 | 8/2001 |
| RU | 2 316 807 C2 | 2/2008 |

(Continued)

OTHER PUBLICATIONS

Reviriego, C.J., et al., Signal shaping dual modular redundancy for soft error tolerant finite impulse response filter, 2011,Electronics Letters vol. 47, No. 23, 2 pages. (Year: 2011).*

(Continued)

*Primary Examiner* — Eric Coleman
(74) *Attorney, Agent, or Firm* — BakerHostetler

(57) ABSTRACT

A flexible Digital Signal Processor module includes a Filter unit comprising a multiplier and an adder, where the multiplier receives input from a memory and a Shift Register Lookup table. The Digital Signal Processor module may implement digital filters such as FIR or IIR filters by providing suitable filter coefficients from the memory and data values from the Shift Register Lookup table. An optional state machine may ensure synchronisation of addressing of the memory Shift Register Lookup table, and between multiple instances of the Digital Signal Processor module where these are required for a particular filter implementation. The proposed architecture offers additional modes of operation wherein operations other than filter implementations are supported.

13 Claims, 4 Drawing Sheets

(56) References Cited

U.S. PATENT DOCUMENTS

| | | | |
|---|---|---|---|
| 6,337,878 B1* | 1/2002 | Endres | H04L 25/0307 |
| | | | 375/229 |
| 6,407,694 B1 | 6/2002 | Cox et al. | |
| 7,248,646 B1 | 7/2007 | Efstathiou | |
| 7,265,576 B1* | 9/2007 | Kondapalli | H03K 19/17728 |
| | | | 326/38 |
| 7,466,782 B1* | 12/2008 | Patapoutian | G11B 20/10009 |
| | | | 360/51 |
| 7,482,951 B1* | 1/2009 | Brungart | G01C 23/00 |
| | | | 340/963 |
| 2002/0067765 A1* | 6/2002 | Lim | H03H 17/0607 |
| | | | 375/229 |
| 2005/0162225 A1* | 7/2005 | Suzuki | H03F 1/3241 |
| | | | 330/149 |
| 2010/0327971 A1* | 12/2010 | Kumagai | H03F 1/0222 |
| | | | 330/149 |
| 2011/0111718 A1* | 5/2011 | Canpolat | H03J 7/02 |
| | | | 455/255 |
| 2014/0235990 A1* | 8/2014 | Yoo | A61B 5/316 |
| | | | 600/383 |
| 2015/0054585 A1* | 2/2015 | Chang | H03F 1/3247 |
| | | | 330/291 |

FOREIGN PATENT DOCUMENTS

| | | |
|---|---|---|
| RU | 2 399 093 C2 | 9/2010 |
| RU | 2 589 401 C2 | 7/2016 |

OTHER PUBLICATIONS

English translation of the Office Action issued in Russian Application No. 2021101169/07(002231) dated Oct. 29, 2021.

English translation of the Search Report issued in Russian Application No. 2021101169/07(002231) dated Oct. 13, 2021.

* cited by examiner

DIGITAL SIGNAL PROCESSOR AND METHOD OF OPERATION

CROSS-REFERENCE TO RELATED APPLICATIONS

This application is a National Stage of International patent application PCT/EP2019/066249, filed on Jun. 19, 2019, which claims priority to foreign European patent application No. EP 18305800.7, filed on Jun. 22, 2018, the disclosures of which are incorporated by reference in their entirety.

FIELD OF THE INVENTION

The present invention relates to Digital Signal Processor Architectures.

BACKGROUND OF THE INVENTION

Digital Signal Processors are digital electronics modules specialised providing dedicated support for Digital Signal Processing operations such as digital filters, compression and the like.

Digital Signal Processor functionality may be provided in many formats, including standalone microprocessors, as part of a "systems in a package" unit, or as specialised blocks in an FPGA architecture.

FPGAs are a type of Programmable Logic Device. They are generally based on a standard programmable logic block, a large number of which are arranged together to implement various functions.

FIG. 1 shows schematically an example of an FPGA system as known in the state of the art.

As shown in FIG. 1, an FPGA chip 10 comprises a number of logic blocks 11. The chip also comprises a number of input/output ports 12. Connecting these logic blocks 11 and input/output ports 12 are a number of tracks 14. At junction points of these tracks are provided a number of programmable routing areas 13, which may also be referred to as switch boxes. In these programmable routing areas there are provided switches which can selectively connect any pair of intersecting tracks, under the control of a logical value stored in a bit cell memory connected with each switch. The bit cell memory values are set at system start up from a non volatile memory. Accordingly, by setting the values in the switch memories as required, any connections of any logic block can be coupled to those of any other logic block, or any input/output port 12. Similarly any one input/output port may be connected to any other input/output port. Thus, by properly configuring the memory units to define the operation of each logic block, and the switch memories 13 to establish appropriate connections between the logic blocks, any desired functionality can be implemented.

While the basic philosophy of the FPGA is based on the possibility of implementing any digital operation by suitable connections and suitable logic values of the standard logic blocks, in certain scenarios such a generic approach is highly inefficient in terms of the chip surface area used to implement a given function, and the energy consumed in operation to apply the desired function. Accordingly, many modern FPGA architectures include specialised blocks 15, comprising circuits specifically designed to support certain specific functions.

Certain FPGA architectures provide such specialised blocks 15 to support Digital Signal Processing operations.

FIG. 2 shows a Digital Signal Processing Block as known in the prior art.

As shown in FIG. 2 there is provided a block 200 comprising two inputs 211 and 212, each buffered by a relay 213 and 214. The inputs 211 and 212 provide values to a multiplier 220, which provides its output to an adder 230, via a further relay 221. The adder receives a second input 215 via a further relay 216, and emits the block output 217 via a further relay 231. The various relays may be used or not depending on implementation details.

As a block in a FPGA architecture as described above, the DSP block may be connected to any suitable logic provided by other blocks of the FPGA. In particular, these other blocks, which will typically be standard logic blocks as described above, may be configured to provide whatever logical inputs may be required for the desired operation. By supplying suitable coefficient values to one input 211 or 212, and a suitably timed series of data values to the other input, and configuring further logic blocks to accumulate the output values, filter and other functions may be implemented.

Examples of such approaches may be found for example in the user guide for the Xilinx Virtex 5 or Xilinx Virtex 4 FPGA architectures.

It will be appreciated in particular that while prior art approaches as described above somewhat improve the efficiency of DSP architectures, their reliance on external logic to support the implementation of specific DSP operations means that the resulting circuits remain sub optimal in terms of the space required, energy consumed, clock distribution and the like. It is desirable to provide a DSP architecture providing more integrated functionality while retaining a high degree of versatility.

SUMMARY OF THE INVENTION

In accordance with the present invention in a first aspect there is provided a programmable Digital Signal Processor comprising a digital filter, a Shift Register Lookup table and a filter memory, wherein the Shift Register Lookup table is coupled to provide input data to the digital filter in a first mode of operation, and the filter memory is coupled to provide filter coefficients to the digital filter in the first mode of operation, wherein the outputs of the filter memory and the Shift Register Lookup table are synchronized so as to produce corresponding filter coefficients and input data together implementing a desired filter configuration.

In a development of the first aspect, the Shift Register Lookup table comprises a shift register, wherein the shift register is configured so as to be operable either as a single continuous shift register, or as a plurality of independently operable shift registers.

In a development of the first aspect, the programmable Digital Signal Processor further comprises a state machine, the state machine providing addressing values to the Shift Register Lookup table and the filter memory. In a development of the first aspect, the programmable addressing values comprise a single address for the Shift Register Lookup table and the filter memory, whereby the values stored in the Shift Register Lookup table and the filter memory are structured such that the single address references the corresponding coefficients and input data for the digital filter in the first mode of operation.

In a development of the first aspect, in a second mode of operation the values stored in the Shift Register Lookup table are output for processing other than by the digital filter.

In a development of the first aspect, in the second mode of operation the Shift Register Lookup table is used as a multiplier input register.

In a development of the first aspect, the digital filter constitutes a component of a Finite Impulse Response filter.

In a development of the first aspect, the digital filter constitutes a component of an Infinite Impulse Response filter comprising a first Finite Impulse Response filter and a second Finite Impulse Response filter in a feedback configuration, where the state machine provides enabling signals coordinate the combination of the outputs of the first Finite Impulse Response and the second Finite Impulse Response to implement the Infinite Impulse Response filter.

In a development of the first aspect, the Digital Signal Processor is implemented in an FPGA architecture comprising a plurality of Lookup Tables, the configuration of each Lookup table being defined by one or more respective memory units programmed at system initiation with a configuration bit stream, wherein the values in the filter memory are also programmed by the configuration bit stream.

In accordance with the present invention in a second aspect there is provided a method of performing Digital Signal Processor operation, the method comprising addressing a Shift Register Lookup table to output data to the Digital Signal Processor in a first mode of operation, and addressing a filter memory to provide coefficients to the digital filter in the first mode of operation, and performing a digital filter operation on the input data using the coefficient.

In a development of the second aspect, the method comprises the further step of structuring the Shift Register Lookup table and the filter memory such that a single address value references corresponding coefficients and input data for the digital filter in the first mode of operation, such that the steps of addressing a Shift Register Lookup table to output a coefficients to the Digital Signal Processor in a first mode of operation, and addressing a filter memory to provide input data to the digital filter in the first mode of operation are performed using the single address value.

In a development of the second aspect, the digital filter operation is a Finite Impulse Response filter operation.

In a development of the second aspect, the digital filter operation is an Infinite Impulse Response filter operation comprising a first Finite Impulse Response operation and a second Finite Impulse Response operation based on feedback values, the method comprising the further step of providing enabling signals coordinating the combination of the results of the first Finite Impulse Response operation and the second Finite Impulse Response operation to obtain an Infinite Impulse Response filter result.

In accordance with the present invention in a third aspect there is provided a program for a computer comprising instructions adapted to implement the steps of the second aspect.

BRIEF DESCRIPTION OF THE DRAWINGS

The above and other advantages of the present invention will now be described with reference to the accompanying drawings, in which.

DETAILED DESCRIPTION

Figure 3:
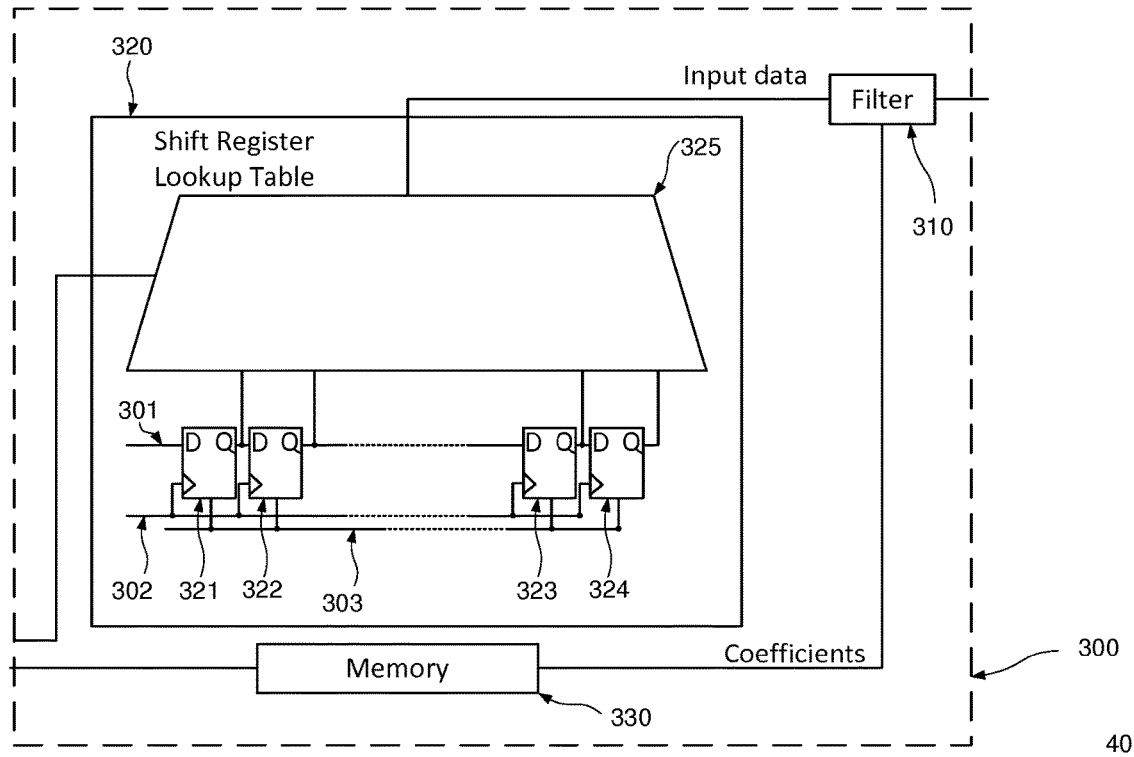
FIG. 3 shows a programmable Digital Signal Processor in accordance with a first embodiment.

FIG. 3 shows a programmable Digital Signal Processor in accordance with a first embodiment.

As shown, the programmable Digital Signal Processor 300 comprises a digital filter 310, a Shift Register Lookup table 320 and a memory 330. The memory may comprise a random access memory such as a RAM or ROM device, cascaded registers or otherwise. The Shift Register Lookup table 320 is coupled to provide input data to the digital filter 310 in a first mode of operation, and the filter memory 330 is coupled to provide filter coefficients to the digital filter 310 in that first mode of operation. The outputs of the filter memory and the Shift Register Lookup table are synchronized so as to produce corresponding filter coefficients and input data together implementing a desired filter configuration.

Figure 1:
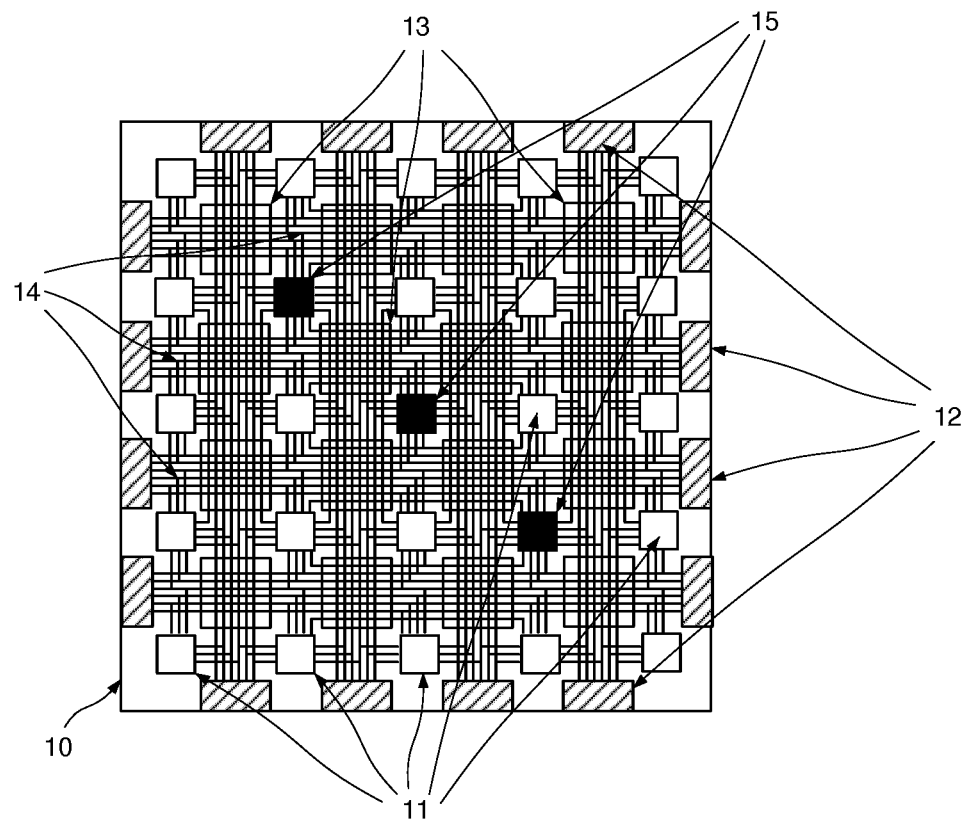
FIG. 1 shows schematically an example of an FPGA system as known in the state of the art.
Figure 2:
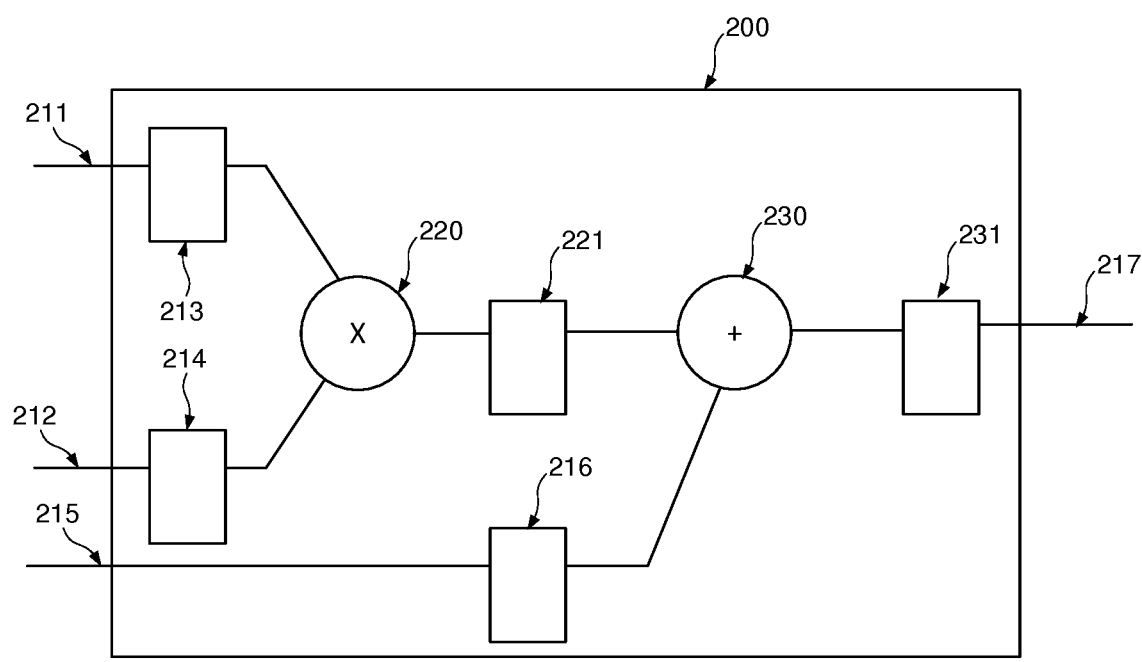
FIG. 2 shows a Digital Signal Processing Block as known in the prior art.

The digital filter comprises a multiplier, configured to multiply a data value and a coefficient value and an adder for the accumulation of successive values, possibly with additional registers, substantially as described above with respect to FIG. 2. Additional delay, summing, multiplexing or other components may be incorporated to extend functionality.

As shown, the Shift Register Lookup table 320 comprises a shift register comprising four flip-flops 321, 322, 323, 324. It will be appreciated that while only four flip-flops are shown, any number of flip-flops may be provided. Since the length of the shift register corresponds to the maximum number of coefficients that may be processed by a single implementation of the DSP of FIG. 3, the number of flip-flops may be selected on the basis of the number of coefficients that can be handled by the filter, i.e. the number of filter taps, which in turn is a basic design constraint of the filter reflecting the complexity of the filter operations that may be performed. A convenient number of flip-flops may be 32 in certain embodiments.

Similarly, the number of addresses in the memory 330 may be equal to the number of coefficients that can be handled by the filter, i.e. the number of filter taps. In other embodiments, the number of the number of addresses in the memory 330 may be less than the number of coefficients that can be handled by the filter, i.e. the number of filter taps. In other embodiments, the number of the number of addresses in the memory 330 may be more than the number of coefficients that can be handled by the filter, i.e. the number of filter taps.

The length of the data word stored in each memory address may be equal to the width of the input data bus. A 24 bit input bus would suggest a 24 bit coefficient, and a Shift Register Lookup table comprising 24 shift registers and multiplexers in parallel. The filter would then perform a multiplication of the two 24 bit values in the filtering operation.

In operation, a continuous stream of binary data values for filtering arrives at input 301, which is gradually clocked through the shift register 321, 322, 323, 324 as processing proceeds as described hereafter. For a given set of values loaded into the flip-flops of the shift register 321, 322, 323, 324, each flip-flop of the shift register 321, 322, 323, 324 up to the number of taps in the filter is addressed in sequence and the value conveyed to the filter 310 as a data value.

Meanwhile, as each flip-flop of the shift register 321, 322, 323, 324 up to the number of taps in the filter is addressed, the memory 330 is addressed simultaneously, whereby the addressed memory location contains the filter coefficient corresponding to the addressed flip-flop, and the resulting output is conveyed to the filter 310 as a set of coefficient values.

The addressed value from the Shift register is thus processed by the filter 310 using the corresponding coefficients provided by the memory 330. The output of the filter is accumulated, and the system then proceeds to address the next flip-flop of the shift register 321, 322, 323, 324, and the corresponding position in the memory 330.

On this basis, each data value in the shift register up to the number of taps in the filter is processed according to its respective set of coefficients, and the results accumulated at the output of the filter. Once each flip-flop in the shift register up to the number of taps in the filter has been addressed, the shift register is clocked e.g. by activating clock bus 302, so that the value of each flip-flop in the shift register is passed to its neighbour, a new data value is clocked into the first flip-flop 321 of the shift register from the data input 301, and the value on the last flip-flop in the shift register is discarded.

The process of addressing each flip-flop of the shift register 321, 322, 323, 324 up to the number of taps in the filter in turn, and processing by the filter 310 using the corresponding coefficients provided by the memory 330 is then started afresh for the new set of values.

This process continues indefinitely until every input value on input channel 301 has been processed.

Figure 4:
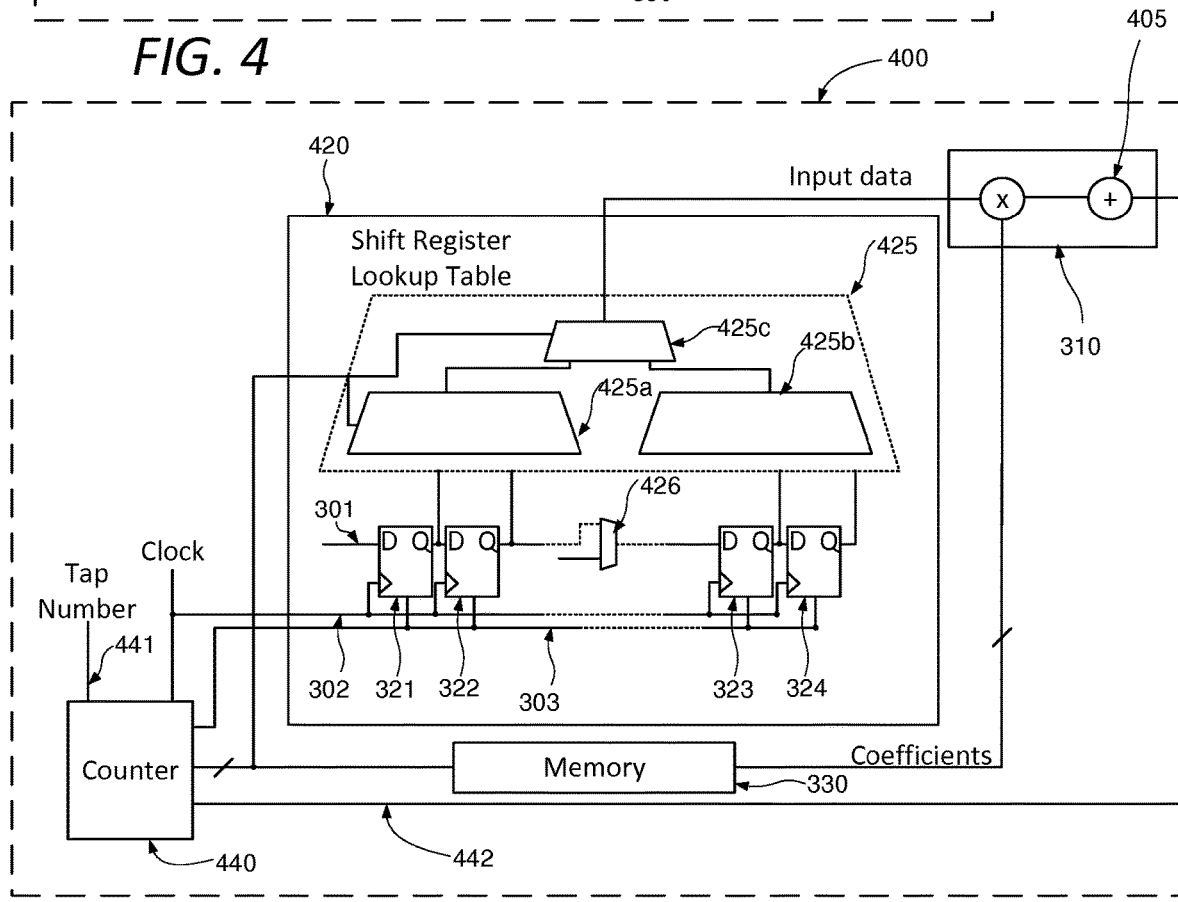
FIG. 4 shows a programmable Digital Signal Processor in accordance with a second embodiment.

FIG. 4 shows a programmable Digital Signal Processor in accordance with a second embodiment.

As described with respect to FIG. 3, the addressing of the coefficient values in the memory 330 and the data value in the Shift Register Lookup Table 420 is performed in a synchronized manner, such that when data is obtained from the Shift Register Lookup Table 420 corresponding to a particular tap position of the filter, the appropriate coefficient for that tap position is obtained from the memory 330. It will be appreciated that this synchronization may be achieved in a variety of manners, for example with reference to a mapping table or the like providing respective address values for the memory 330 on one hand and the Shift Register Lookup Table 420 on the other.

It will further be appreciated that the memory 330 Shift Register Lookup Table 420 may be structured so that the same address value points to corresponding values in the memory 330 and the data value in the Shift Register Lookup Table 420.

As such there is provided a programmable Digital Signal Processor 400 comprising a digital filter 310, a Shift Register Lookup table 420 and a memory 330, wherein the Shift Register Lookup table 420 is coupled to provide input data to the digital filter 310 in a first mode of operation, and the filter memory 330 is coupled to provide filter coefficients to the digital filter 310 in the first mode of operation, wherein the outputs of the filter memory 330 and the Shift Register Lookup table 420 are synchronized so as to produce corresponding filter coefficients and input data together implementing a desired filter configuration.

FIG. 4 presents one method of achieving synchronization, whereby there is provided a counter 440, receiving a clock input 302 and a tap number input 441. The counter 440 is further provided with an output which outputs the current count value. The counter 440 may be seen more generally as constituting a part or the entirety of a synchronization state machine. The count value is fed to the Memory 330 and Shift Register Lookup Table 420 as an address value. On this basis, coefficient values are loaded into the memory 330 in sequential positions so that as the count value increments, successive coefficient values corresponding to successive tap positions are selected. By the same token, as the count value increments, successive flip-flops in the shift register corresponding to successive tap positions are selected by the multiplexer 425. Accordingly, the count value serves to address the Memory 330 and Shift Register Lookup Table 420 in a synchronized manner. The counter is configured to restart its count when it reaches the tap number count (which depending on implementation details may be any number up to the number of flip-flops in the Shift Register Lookup Table 420). In certain variants the counter may be provided with an overflow output, which outputs a predetermined value when the count value reaches the tap number input. This output may be used to coordinate the operations of multiple programmable Digital Signal Processors, for example as described in further detail below.

As shown, in the arrangement of FIG. 4 the multiplexer 425 is implemented as two sub-multiplexers 425a and 425b, each receiving a portion of the outputs of the shift register 321-324. Each sub-multiplexer 425a and 425b may receive half of the outputs of the shift register 321-324, or the outputs of the shift register 321-324 may be divided between the two sub-multiplexers in some other fashion. The outputs of the two sub-multiplexers 425a and 425b are themselves selected by a third sub-multiplexer 435c, so that the three sub-multiplexers 425a, 425b, 425c are logically equivalent to the multiplexer 325 of FIG. 3. A further multiplexer 426 is provided at the point in the shift register 321-324 corresponding to the point where shift register outputs are sent to one sub-multiplexer or the other, as shown between flip-flop 322 and flip-flop 323. With one select value the multiplexer 426 couples the input of flip-flop 323 to the output of flip-flop 322, so as to maintain a single shift register in operation. With another select value the multiplexer 426 decouples the input of flip-flop 323 from the output of flip-flop 322 in favour of an alternative input, so as to provide two separate shift registers for example as described with reference to FIG. 7 below.

As shown, the filter 310 of FIG. 4 further comprises an accumulator 405 as discussed above, which may be provided to accumulate successive outputs from the filter 310. By this means, for example, a full Finite Impulse Response filter may be implemented by accumulating the values output by the filter 310 for each tap position, as obtained using the respective data values and coefficient values as indicated above.

As such the programmable Digital Signal Processor may further comprise a state machine 440 providing addressing values to the Shift Register Lookup table and the memory where the single address references the corresponding coefficients and input data for the digital filter in the first mode of operation.

In certain embodiments, a DSP module such as those described in with respect to FIG. 3 or 4 may be implemented as a DSP block in an FPGA architecture. Each DSP block may comprise one or more DSP modules such as those described in with respect to FIG. 3 or 4. Each FPGA may comprise any number of DSP blocks, as well as standard logic blocks and blocks of other type as appropriate to the general intended use of the FPGA architecture. As such, the Digital Signal Processor may be implemented in an FPGA architecture comprising a plurality of Lookup Tables, the configuration of each Lookup Table being defined by one or more respective memory units programmed at system initiation with a configuration bit stream, wherein the values in the filter memory are also programmed by the configuration bit stream.

Figure 5:
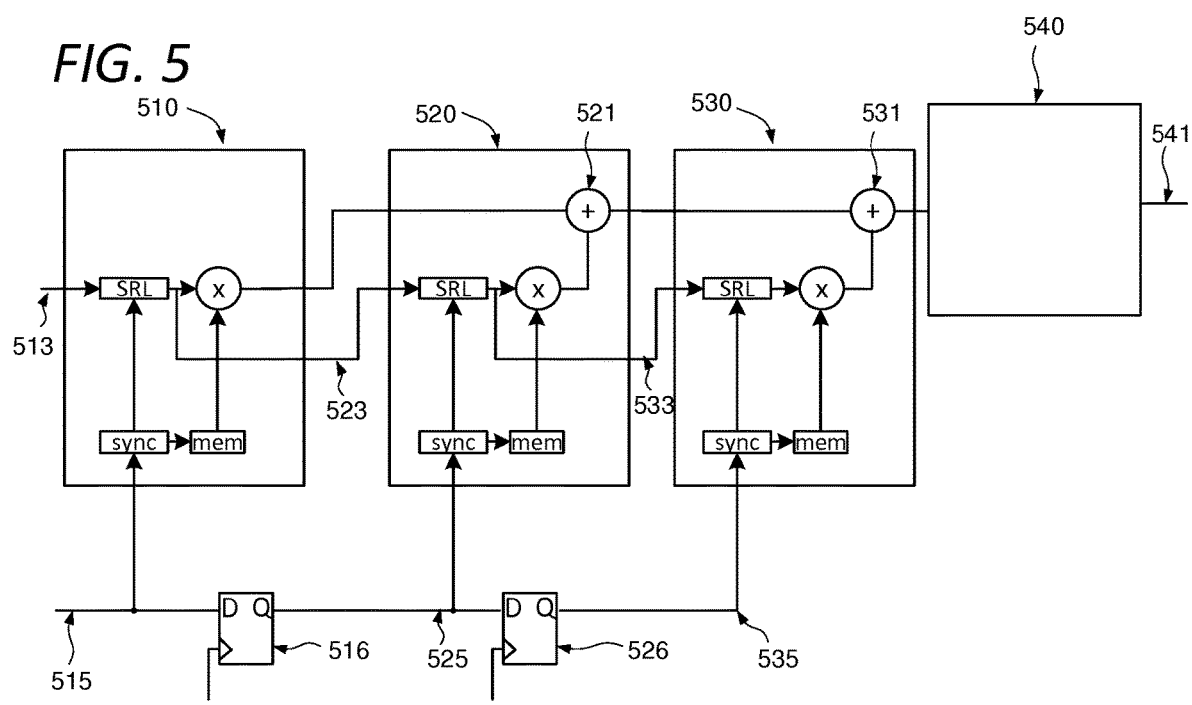
FIG. 5 presents a parallel implementation of a Finite Impulse Response filter in accordance with an embodiment.

FIG. 5 presents a parallel implementation of a Finite Impulse Response filter in accordance with an embodiment.

A FIR filter based on a Semi-parallel implementation may be used in a context where the number of tap is larger than the number of taps provided by a single DSP module for example as described with reference to FIG. 3 or 4, or where the frequency requirement can be better met by a number of DSP modules configured to compute several taps per sampling cycle.

By way of example, in a case where a 12-tap filter with 3 DSPs is used the following decomposition might apply:

$$\sum_{n=1}^{12} x_n \cdot C_n =$$

$$\sum_{n=1,n=n+4}^{9} x_n \cdot C_n + \sum_{n=2,n=n+4}^{10} x_n \cdot C_n + \sum_{n=3,n=n+4}^{11} x_n \cdot C_n + \sum_{n=4,n=n+4}^{12} x_n \cdot C_n$$

Where n is the index of each tap
Cn is the Coefficient of each tap n
Xn is the data value at each tap n It may be noted that each sub-term presents the same structure and can be implemented using a sequence of 3 cascaded DSP (sub-terms are an addition of 4 products).

On this basis, as shown in FIG. 5 there is provided a first DSP module 510 corresponding for example to that described with reference to FIG. 3 or 4 above, a second DSP module 520 corresponding for example to that described with reference to FIG. 3 or 4 above, and a third DSP module 530 corresponding for example to that described with reference to FIG. 3 or 4 above. Each DSP module 510, 520, 530 is shown schematically comprising a synchronization element, Shift Register Lookup table element, and memory element, as well as the multiplier and adder of the filter element.

Each of these three DSP modules is configured as a FIR filter for example as described with reference to element 400 of FIG. 4. Each of the three DSP modules is configured to handle a sequential subset of the total taps of the filter to be implemented by the system as a whole, so that the total number of taps implemented across all three DSP modules is the number of taps of the final filter.

The first DSP module 510 receives a data input 513. This same data is fed to the second DSP module 520 from the output of the Shift Register Lookup Table of the first DSP module at input 523, and to third DSP module 530 at input 533 from the output of the Shift Register Lookup table of the second DSP module, such that the Shift Register Lookup tables of the respective DSP modules constitute a delay line, so that the second DSP module 520 receives the data n cycles after the first DSP module 510 and the third DSP module 520 receives the data 2n cycles after the first DSP module 510.

Similarly, the first DSP module 510 receives a synchronisation signal 515. A corresponding synchronisation signal 525 is fed to the second DSP module 520 and a corresponding synchronization signal 535 to third DSP module 530 via a delay line represented by flip-flops 516 and 526, so that the second DSP module 520 is enabled one cycle after the first DSP module 510 and the third DSP module 520 is enabled two cycles after the first DSP module 510. The outputs of the first and second DSP modules 510 and 520 are summed at an adder 521 of the second DSP module, and the outputs of adder 521 and the third DSP module 531 are summed at the adder 531 of the third DSP module. The output of adder 531 is accumulated over a complete filter processing cycle by module 540, which as discussed above may be implemented using the accumulation unit of a further DSP module, such as element 405 as described with reference to FIG. 4.

By this approach, a FIR of arbitrary size may be implemented by connecting a suitable number of DSP modules as described above, with the provision of suitable coefficients and synchronization signals. It will be appreciated that any desired number of DSP modules may be connected in this manner.

Figure 6:
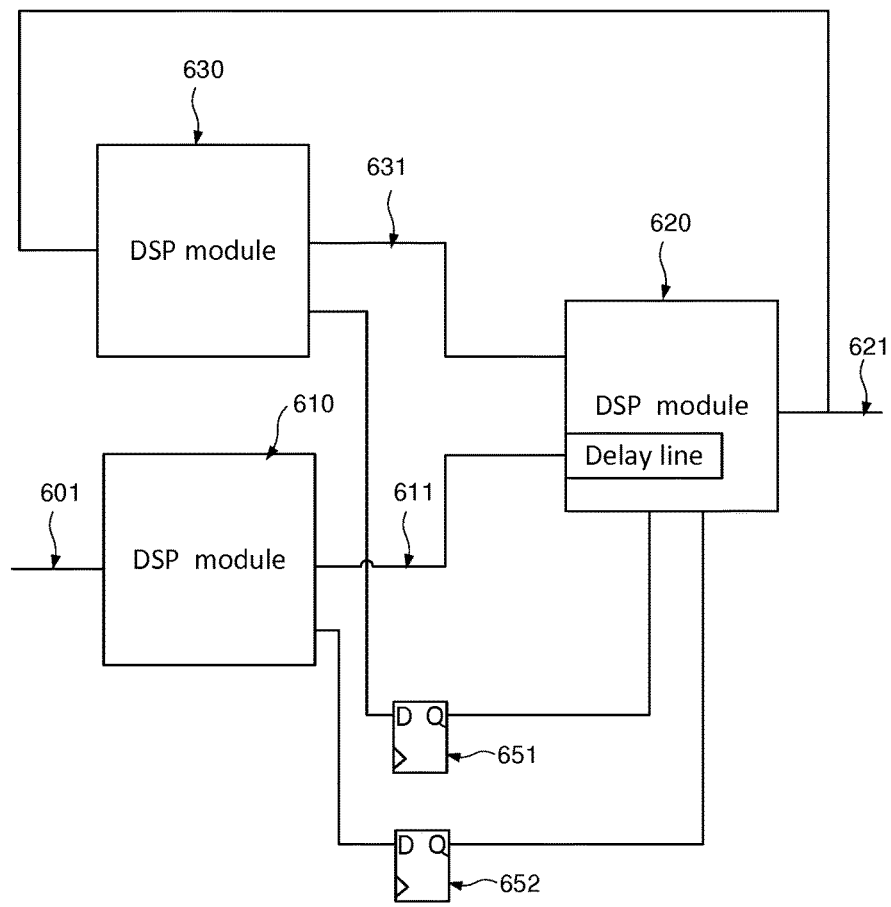
FIG. 6 presents a parallel implementation of an Infinite Impulse Response filter in accordance with an embodiment.

FIG. 6 presents a parallel implementation of an Infinite Impulse Response filter in accordance with an embodiment.

The general formula describing an IIR filter is:

$$A_0 \cdot Y_n = \sum_{k=0}^{N_b} B_k \cdot X_{n-k} - \sum_{k=1}^{N_a} A_k \cdot Y_{n-k}$$

The formula may be simplified using $A_0=1$.

The first sum defines a FIR filter of $N_b$ taps. This FIR filter is applicable on the sampling input.

The second sum defines a FIR filter of $N_a$ taps. This FIR filter is applicable on the IIR filter output. This is the feedback loop of the filter.

On this basis, as shown in FIG. 6 there is provided a first DSP module 610 corresponding for example to that described with reference to FIG. 3 or 4 above, a second DSP module 620 corresponding for example to that described with reference to FIG. 3 or 4 above, and a third DSP module 630 corresponding for example to that described with reference to FIG. 3 or 4 above.

Two of these three DSP modules, 610 and 630 are configured as a FIR filter for example as described with reference to element 400 of FIG. 4.

Specifically, the first DSP module 610 defines a FIR filter of $N_b$ taps. This FIR filter is applicable on the sampling input 601.

The third DSP module 630 defines a FIR filter of $N_a$ taps. This FIR filter is applicable on the IIR filter output. This is the feedback loop of the filter.

The FIR filter operates fast enough to produce one result per sampling cycle, so that it is possible to accumulate both results in a synchronized manner. Both filters are fully registered, but they are working at a much higher frequency than the sampling frequency, so that a final result can be obtained in 1 sampling cycle. The larger the filters are, the less efficient an IIR filter is as the clock ratio is directly related to the number of taps in the largest filter.

To simply resolve filter synchronization, the following restrictions are applied in the present embodiment:

The direct FIR sub-filter, implemented by the first DSP module 610 is limited to the number of taps that can be implemented in a single DSP module, using the single DSP approach as described for example with reference to FIG. 4, so as to grant the same pipelining delay in all configurations.

The loopback FIR sub-filter implemented by the third DSP module 630 is limited to half the number of taps of the first DSP module 610, and is also implemented using a single DSP approach as described for example with reference to FIG. 4. To get the third DSP module 630 operating fast enough to generate its result during a single sampling period of the first DSP module 610, it is required to get the third DSP module 630 operating at 4 times the rate of the first DSP module 610. This may be achieved by implementing this filter with interleaved coefficients with 0 constant. The interleaved approach explains the 16 taps limitation.

The sub-filter summation and synchronization is performed in the second DSP module 620 using the Shift Register Lookup table and the ALU.

The second DSP module 620 receives timing information from registers 651 and 652, which receive the coefficient overflow indication 442 from the first and third DSP modules respectively, as a basis for synchronizing the signals. The synchronization of the result from DSP Modules 610 and 630 requires the provision of a delay line on output the output of Module 610 to get the same depth as DSP module 610 (correction for the difference in number of taps N versus N/2). This may be done using the Shift Register Lookup table of DSP module 620 in a second mode of operation where there are insufficient dedicated registers in the DSP configuration. The specific number of registers will depend on implementation details, but by way of example if 3 levels of pipe are required, as other signals with the 2*3=6 flip-flops, and the DSP circuits provide only 2, the extra level may be provided by the Shift Register Lookup table of a further DSP module.

Accordingly, the digital filter may be an Infinite Impulse Response filter comprising a first Finite Impulse Response and a second Finite Impulse Response in a feedback configuration, where the state machine provides synchronization signals coordinating the combination of the outputs of the first Finite Impulse Response and the second Finite Impulse Response to implements the Infinite Impulse Response filter.

In the preceding examples, a number of different configurations based on DSP modules for example as described with respect to FIG. 3 or 4 have been presented. In some of these, individual DSP modules have been used for purposes other than the implementation of filter operations in the module itself, but rather to provide other processing, storage or synchronization functions to other DSP modules in the proposed system. It will be appreciated that the components and configuration of the DSP modules for example as described with respect to FIG. 3 or 4, and in particular the availability of a freely accessible Shift Register Lookup Table 320, and Memory unit 330, make each such filter unit highly flexible and applicable to many applications besides the implementation of filter operations. DSP modules for example as described with respect to FIG. 3 or 4 may for example be used to implement a multiplier, capable of handling large, complex or signed values, a multiplexer, shift register and so on.

Figure 7:
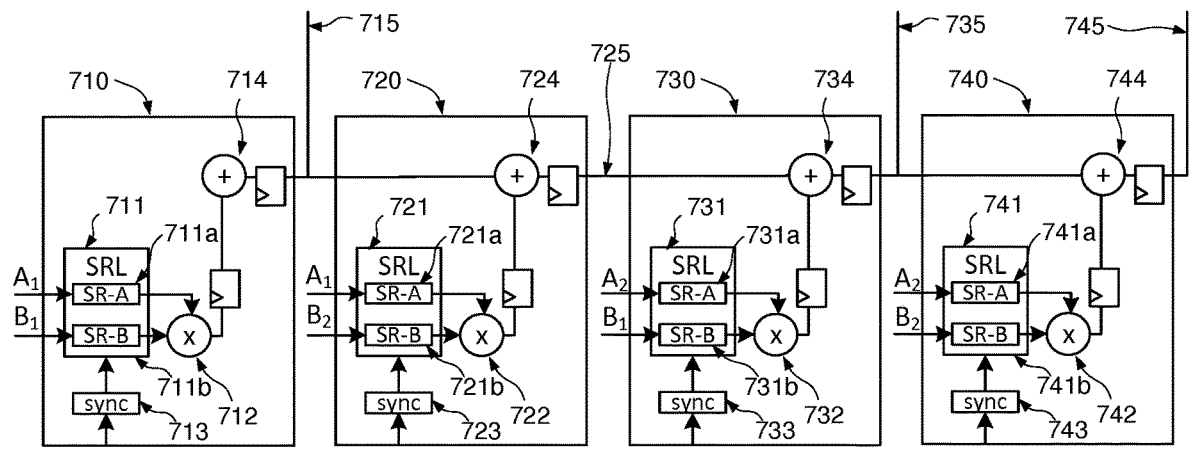
FIG. 7 shows a signed multiplier implemented using a filter in accordance with an embodiment.

FIG. 7 shows a signed multiplier implemented using a filter in accordance with an embodiment.

A multiplier of any desired size may be implemented using a series of concatenated DSP modules as described with reference to FIG. 3 or 4.

47×47 bit multiplier may be defined based on the following decomposition:
Considering:

$$A[46:0] \times B[46:0] =$$

then, $$A = \{A[46:23], A[22:0]\} = \{A2, A1\}$$

$$B = \{B[46:23], B[22:0]\} = \{B2, B1\}$$

$$A \times B = \{A2, A1\} \times \{B2, B1\} = \{A2 \times B2, A1 \times B2 + A2 \times B1, A1 \times B1\} ==$$

$$\{P3 + (A1 \times B2 + A2 \times B1 + (A1 \times B1)[46, 23])[46, 23],$$

$$(A1 \times B2 + A2 \times B1 + (A1 \times B1)[46, 23])[22, 0], (A1 \times B1)[22, 0]\}$$

As implied in the foregoing, the multiplier separates the data into a set of the 23 least significant bits (on the basis that the multiplier in the present example handles 24 signed bits, with one bit being discarded, and 23 signed bits being retained) on one hand and a set of the 24 most significant bits on the other. A shift is operated between the processing of a corresponding set of most significant bits and least significant bits so that the corresponding results can be combined at the next respective DSP module.

As shown, the system comprises four DSP modules 710, 720, 730, 740, each corresponding substantially to the arrangements described with respect to FIG. 3 or 4. In particular, DSP module 710 comprises Shift Register Lookup table 711, synchronisation state machine 713, corresponding for example to that of FIG. 4, and a multiplier 712 and adder 714 together corresponding to the filter unit of FIG. 3 or 4. As shown, the shift register of the Shift Register Lookup table 711 is in a two part configuration as described with reference to FIG. 4 above, with input A1 being fed to a first section of the shift register 711a, and second input B1 being fed to a first section of the shift register 711b. Each shift register 711a, 711b feeds data to a respective input of the multiplier 712. The output of the multiplier 712 is fed through the adder 714 to an output 715. It will be appreciated that since in the case of the first DSP module the adder 714 adds zero to the output of the multiplier, this component might equally be bypassed-it is retained in the present example to demonstrate the flexibility of the proposed architecture.

Similarly, DSP module 720 comprises Shift Register Lookup table 721, Synchronisation state machine 723, corresponding for example to that of FIG. 4, and a multiplier 722 and adder 724 together corresponding to the filter unit of FIG. 3 or 4. As shown, the shift register of the Shift Register Lookup table 721 is in a two part configuration as described with reference to FIG. 4 above e.g. by the operation of the Multiplexer 426, with input A1 being fed to a first section of the shift register 721a, and second input B2 being fed to a first section of the shift register 721b. Each shift register 721a, 721b feeds data to a respective input of the multiplier 722. The adder 724 adds the output of the multiplier 722 and the output 715 of the preceding DSP module 710 subject to the shift between most significant bits and least significant bits in accordance with the decomposition above. The output of the multiplier 722 is fed through the adder 724 to an output 725.

Similarly, DSP module 730 comprises Shift Register Lookup table 731, Synchronisation state machine 733, corresponding for example that of FIG. 4, and a multiplier 732 and adder 734 together corresponding to the filter unit of FIG. 3 or 4. As shown, the shift register of the Shift Register Lookup table 731 is in a two part configuration as described with reference to FIG. 4 above, with input A2 being fed to a first section of the shift register 731a, and second input B1 being fed to a first section of the shift register 731b. Each shift register 731a, 731b feeds data to a respective input of the multiplier 732. The adder 734 adds the output of the multiplier 732 and the output 725 of the preceding DSP module 720. The output of the multiplier 732 is fed through the adder 734 to an output 735.

Similarly, DSP module 740 comprises Shift Register Lookup table 741, Synchronisation state machine 743, corresponding for example to that of FIG. 4, and a multiplier 742 and adder 744 together corresponding to the filter unit of FIG. 3 or 4. As shown, the shift register of the Shift Register Lookup table 741 is in a two part configuration as described with reference to FIG. 4 above, with input A2 being fed to a first section of the shift register 741a, and second input B2 being fed to a first section of the shift register 741b. Each shift register 741a, 741b feeds data to a respective input of the multiplier 742. The adder 744 adds the output of the multiplier 742 and the output 735 of the preceding DSP module 730 subject to the shift between most significant bits and least significant bits in accordance with the decomposition above. The output of the multiplier 742 is fed through the adder 744 to an output 745.

Output component $P_{[22:0]}$ is available, subject to suitable timing correction, at the output 715. Output component $P_{[45:23]}$ is available, subject to suitable timing correction, at the output 735. Output component $P_{[93:46]}$ is available, subject to suitable timing correction, at the output 745.

The respective shift registers 711a, 711b, 721a, 721b, 731a, 731b, 741a, 741b, as described above are used in the described configuration to provide synchronization of signals across the multiplier, so that the values on each output in any given clock cycle correspond to the same set of input values A1, B1, A2 and B2. By way of example, the shift registers 711a, 711b, may each provide one flip-flop's worth of delay to their respective signals, the shift registers 721a, 721b, may each provide two flip-flop's worth of delay to their respective signals, the shift registers 731a, 731b, may each provide three flip-flop's worth of delay to their respective signals, and the shift registers 741a, 741b, may each provide four flip-flop's worth of delay to their respective signals. In some embodiments DSP units may provide a number of input registers specifically for this purpose, which might be used instead of, or as well as the shift registers of the Shift Register Lookup table. For example, where a particular DSP unit implementation provides two input registers, the first and second DSP units may rely solely on these dedicated input registers for synchronization, whilst the third and fourth registers might use dedicated input registers for two levels of delay, and then use the shift registers of the Shift Register Lookup Table to provide the one additional level of delay required for the third DSP module, and the two levels of delay required for the fourth DSP module. Furthermore, delay operations might be handled differently for the A input and the B input of each DSP module on this basis, depending on the available dedicated input relays.

As shown, each DSP module provides an additional relay between the multiplier 712, 722, 732, 742 and the adder 714, 724, 734, 744, and between the adder 714, 724, 734, 744 and the output 715, 725, 735, 745 for synchronization purposes. Some or all of these relays may be omitted depending on the implementation specifics of certain embodiments, or additional relays may be provided depending on application requirements for a given implementation.

The use of the SRL of the DSP units to simulate the extra required registers for the timing of the multiplication calculate constitutes an example of use of DSP modules as described with reference to FIG. 3 or 4 in a second mode of operation.

In this second mode of operation as shown with respect to FIG. 7, the Shift Register Lookup table of a DSP module is used as a multiplier input register.

Accordingly there is disclosed a flexible Digital Signal Processor module comprising a Filter unit comprising a multiplier and an adder, where the multiplier receives input from a memory and a Shift Register Lookup table. The Digital Signal Processor module may implement digital filters such as FIR or IIR filters by providing suitable filter coefficients from the memory and data values from the Shift Register Lookup table. An optional state machine may ensure synchronisation of addressing of the memory Shift Register Lookup table, and between multiple instances of the Digital Signal Processor module where these are required for a particular filter implementation. The proposed architecture offers additional modes of operation in which operations other than filter implementations are supported.

On this basis, in a second mode of operation the values stored in the Shift Register Lookup table are output for processing other than by the digital filter.

Figure 8:
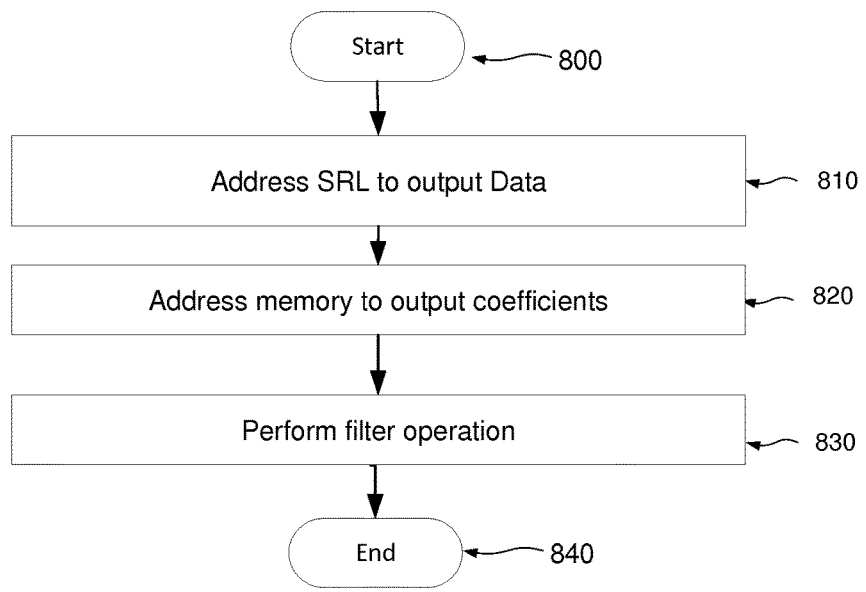
FIG. 8 presents a method of performing Digital Signal Processor operation in accordance with an embodiment.

FIG. 8 presents a method of performing Digital Signal Processor operation in accordance with an embodiment.

As shown, the method starts at step 800 before proceeding to step 810 at which a Shift Register Lookup table is addressed to output data to the Digital Signal Processor in a first mode of operation. The method then proceeds to step 820 at which a filter memory is addressed to provide coefficients to the digital filter in the first mode of operation. The method then proceeds to step 830 of performing a digital filter operation on the input data using the coefficient before terminating at step 840.

The method of FIG. 8 may be performed iteratively, for each of a plurality of coefficients defining a digital filter.

Steps 810 and 820 may be performed in the opposite order, i.e. step 820 before 810, or the two may be performed in parallel.

The method may comprise a further step of structuring the Shift Register Lookup table and the filter memory such that a single address value references corresponding coefficients and input data for the digital filter in the first mode of operation, such that the steps of addressing a Shift Register Lookup table to output data to the Digital Signal Processor in the first mode of operation, and addressing a filter memory to provide coefficients to the digital filter in the first mode of operation are performed using that single address value.

In certain instances of the method of FIG. 8 the digital filter operation may be a Finite Impulse Response filter operation.

In certain instances of the method of FIG. 8 the digital filter operation may be an Infinite Impulse Response filter operation comprising a first Finite Impulse Response operation and a second Finite Impulse Response operation based on feedback values, the method comprising the further step of providing enabling signals coordinating the combination of the results of the first Finite Impulse Response operation and the second Finite Impulse Response operation to obtain an Infinite Impulse Response filter result.

In some embodiments, the methods and processes described herein may be implemented in whole or part by a computing device. These methods and processes may be implemented by means of computer-application programs or services, an application-programming interface (API), a library, and/or other computer-program product, or any combination of such entities. In particular, there may be provided a program for a computer comprising instructions adapted to implement the steps of the method of FIG. 8, or any of the variants thereof described above.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A programmable Digital Signal Processor comprising a digital filter, a Shift Register Lookup table and a filter memory, wherein said Shift Register Lookup table is coupled to provide input data to said digital filter in a first mode of operation, and said filter memory is coupled to provide filter coefficients to said digital filter in said first mode of operation, wherein the outputs of said filter memory and said Shift Register Lookup table are synchronized so as to produce corresponding filter coefficients and input data together implementing a desired filter configuration,
    said programmable Digital Signal Processor further comprising a state machine, said state machine providing addressing values to said Shift Register Lookup table and said filter memory,
    wherein said addressing values comprise a single address for said Shift Register Lookup table and said filter memory, whereby the values stored in said Shift Register Lookup table and said filter memory are structured such that said single address references said corresponding coefficients and input data for said digital filter in said first mode of operation.

2. The programmable Digital Signal Processor of claim 1, wherein said Shift Register Lookup table comprises a shift register, wherein said shift register is configured so as to be operable either as a single continuous shift register, or as a plurality of independently operable shift registers.

3. The programmable Digital Signal Processor of claim 1, wherein in a second mode of operation the values stored in said Shift Register Lookup table are output for processing other than by said digital filter.

4. The programmable Digital Signal Processor of claim 3, wherein in said second mode of operation said Shift Register Lookup table is used as a multiplier input register.

5. The programmable Digital Signal Processor of claim 1, wherein said digital filter constitutes a component of a Finite Impulse Response filter.

6. The programmable Digital Signal Processor of claim 1, wherein said digital filter constitutes a component of an Infinite Impulse Response filter comprising a first Finite Impulse Response filter and a second Finite Impulse Response filter in a feedback configuration, where said state machine provides enabling signals coordinate the combination of the outputs of said first Finite Impulse Response filter and said second Finite Impulse Response filter to implement said Infinite Impulse Response filter.

7. The programmable Digital Signal Processor of claim 1, wherein said Digital Signal Processor is implemented in an FPGA architecture comprising a plurality of Lookup Tables, the configuration of each said Lookup table being defined by one or more respective memory units programmed at system initiation with a configuration bit stream, wherein the values in said filter memory are also programmed by said configuration bit stream.

8. A method of performing Digital Signal Processor operation, said method comprising:
    addressing a Shift Register Lookup table to output data to said Digital Signal Processor in a first mode of operation, and addressing a filter memory to provide coefficients to said digital filter in said first mode of operation, performing a digital filter operation on said input data using said coefficient;
    comprising the further step of structuring said Shift Register Lookup table and said filter memory such that a single address value references corresponding coefficients and input data for said digital filter in said first mode of operation, such that said steps of addressing a Shift Register Lookup table to output a coefficients to said Digital Signal Processor in a first mode of operation, and addressing a filter memory to provide input data to said digital filter in said first mode of operation are performed using said single address value.

9. The method of claim 8, wherein said digital filter operation is a Finite Impulse Response filter operation.

10. The method of claim 8, wherein said digital filter operation is an Infinite Impulse Response filter operation comprising a first Finite Impulse Response operation and a second Finite Impulse Response operation based on feedback values, said method comprising the further step of providing enabling signals coordinating the combination of the results of said first Finite Impulse Response operation and said second Finite Impulse Response operation to obtain an Infinite Impulse Response filter result.

11. A non-transitory, computer-readable medium comprising instructions adapted to implement the steps of claim 8.

12. A programmable Digital Signal Processor comprising a digital filter, a Shift Register Lookup table and a filter memory, wherein said Shift Register Lookup table is coupled to provide input data to said digital filter in a first mode of operation, and said filter memory is coupled to provide filter coefficients to said digital filter in said first mode of operation, wherein the outputs of said filter memory and said Shift Register Lookup table are synchronized so as to produce corresponding filter coefficients and input data together implementing a desired filter configuration,
    said programmable Digital Signal Processor further comprising a state machine, said state machine providing addressing values to said Shift Register Lookup table and said filter memory,
    wherein said digital filter constitutes a component of an Infinite Impulse Response filter comprising a first Finite Impulse Response filter and a second Finite Impulse Response filter in a feedback configuration, where said state machine provides enabling signals coordinate the combination of the outputs of said first Finite Impulse Response filter and said second Finite Impulse Response filter to implement said Infinite Impulse Response filter.

13. A method of performing Digital Signal Processor operation, said method comprising:
    addressing a Shift Register Lookup table to output data to a Digital Signal Processor in a first mode of operation, and addressing a filter memory to provide coefficients to a digital filter in said first mode of operation, performing a digital filter operation on input data using said coefficients;
    wherein said digital filter operation is an Infinite Impulse Response filter operation comprising a first Finite Impulse Response operation and a second Finite Impulse Response operation based on feedback values, said method comprising the further step of providing enabling signals coordinating the combination of the results of said first Finite Impulse Response operation and said second Finite Impulse Response operation to obtain an Infinite Impulse Response filter result.

* * * * *